US009465076B2

United States Patent
Sato

(10) Patent No.: US 9,465,076 B2
(45) Date of Patent: Oct. 11, 2016

(54) SLIP RING AND SLIP RING ELECTRICAL SYSTEM

(71) Applicant: CANON KABUSHIKI KAISHA, Tokyo (JP)

(72) Inventor: Shuuichi Sato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 289 days.

(21) Appl. No.: 13/975,015

(22) Filed: Aug. 23, 2013

(65) Prior Publication Data

US 2014/0055153 A1    Feb. 27, 2014

(30) Foreign Application Priority Data

Aug. 27, 2012 (JP) ................................. 2012-186596

(51) Int. Cl.
    *G01R 31/34*      (2006.01)
    *H01R 39/58*      (2006.01)

(52) U.S. Cl.
    CPC ............... *G01R 31/34* (2013.01); *H01R 39/58* (2013.01); *G01R 31/343* (2013.01)

(58) Field of Classification Search
    CPC .... G01R 31/34; G01R 31/343; H01R 39/58; H01R 39/46
    USPC ........................................................ 324/750.3
    See application file for complete search history.

(56) References Cited

U.S. PATENT DOCUMENTS

| | | | | |
|---|---|---|---|---|
| 4,020,367 A | * | 4/1977 | Yamashiro | G05F 3/247 323/315 |
| 5,402,461 A | * | 3/1995 | Kudo | 378/15 |
| 2006/0087843 A1 | * | 4/2006 | Setomoto | H05B 33/0803 362/249.01 |
| 2006/0273777 A1 | * | 12/2006 | Suzuki | G05F 1/575 323/312 |
| 2006/0291111 A1 | * | 12/2006 | Itoh | G05F 1/573 361/18 |
| 2011/0309943 A1 | * | 12/2011 | Lohr | 340/657 |
| 2012/0169176 A1 | * | 7/2012 | Toledo et al. | 310/240 |

FOREIGN PATENT DOCUMENTS

| | | |
|---|---|---|
| JP | S59-075161 A | 4/1984 |
| JP | H06-014500 A | 1/1994 |
| JP | H06-007710 U | 2/1994 |

(Continued)

OTHER PUBLICATIONS

Samy, Non-Patent Literature, Espacenet translated WO2012010763A1 "Method and Device for Monitoring the Wear of Sliding Electrical Contacts of a Rotating Commutator for an Automotive Vehicle" Jan. 26, 2012.*

*Primary Examiner* — Melissa Koval
*Assistant Examiner* — Courtney McDonnough
(74) *Attorney, Agent, or Firm* — Canon U.S.A. Inc., IP Division

(57) ABSTRACT

A slip ring includes an exterior, a plurality of brushes, a plurality of rings, a brush fixing member that causes the plurality of brushes to contact the plurality of rings and supports the plurality of brushes, and a rotating shaft inserted into the plurality of rings and supports the plurality of rings. The slip ring also includes a reference signal generation unit configured to generate a reference signal, and a detection unit configured to detect a signal, wherein a circuit is formed by the reference signal generation unit, a first brush, which is at least one of the plurality of brushes, a first ring that contacts the first brush, and the detection unit, and wherein a state of contact of the first brush and the first ring is detected based on the signal detected by the detection unit.

18 Claims, 8 Drawing Sheets

(56) References Cited

FOREIGN PATENT DOCUMENTS

| JP | H0663034 A | 3/1994 | | |
| JP | EP0624878 A2 * | 11/1994 | ............... | G11C 7/10 |
| JP | 9-28060 A | 1/1997 | | |
| JP | 2003215189 A * | 7/2003 | ............. | G01R 31/02 |
| WO | 2011/161348 A1 | 12/2011 | | |
| WO | 2012/010763 A1 | 1/2012 | | |
| WO | WO 2012010763 A1 * | 1/2012 | ............. | H01R 39/58 |

* cited by examiner

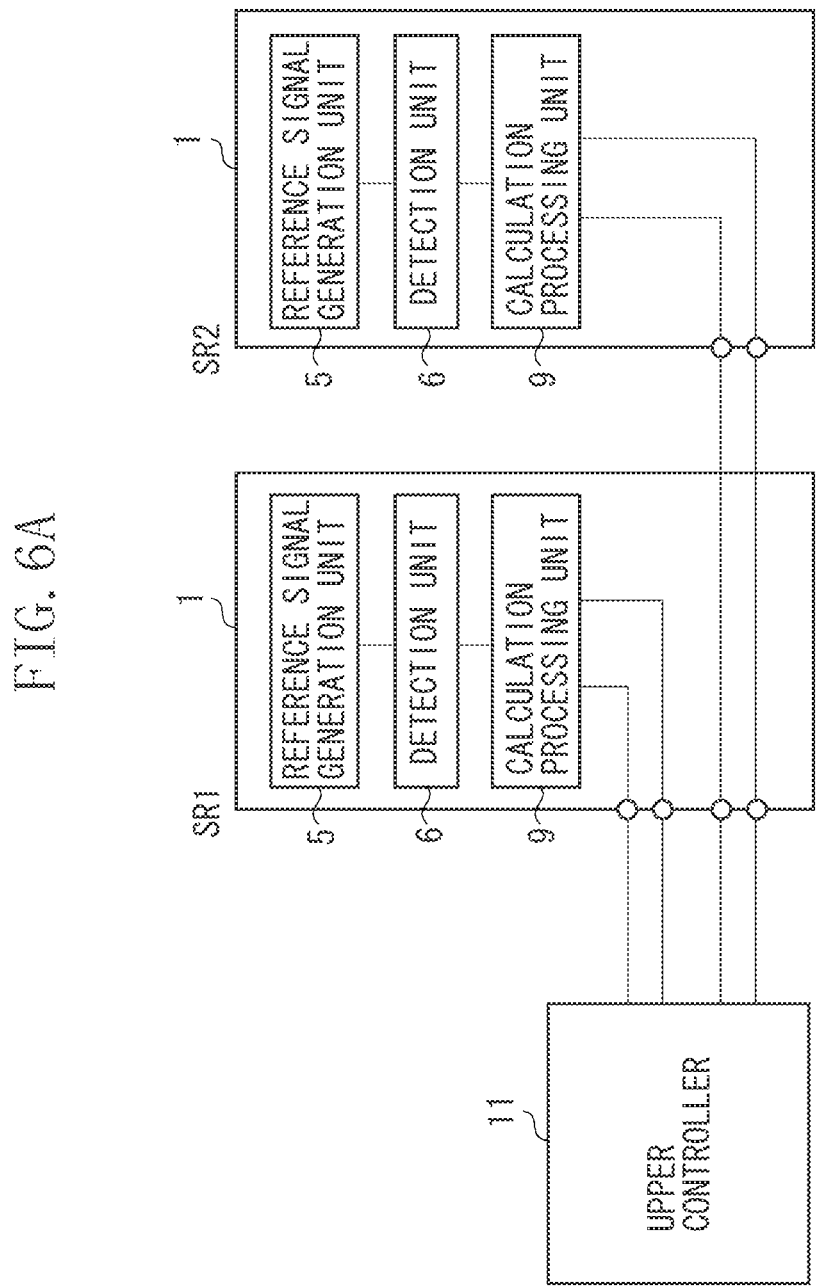

SLIP RING AND SLIP RING ELECTRICAL SYSTEM

BACKGROUND OF THE INVENTION

1. Field of the Invention

The present disclosure relates to a slip ring.

2. Description of the Related Art

A slip ring is widely used as a means for transmitting power or a signal from one part to another part via a rotating part such as a joint of a robot arm, for example. A slip ring includes a rotating shaft and brushes and typically has the following structure.

The rotating shaft is inserted into rings, which are made of a conductive material, and the rings are concentrically attached to and supported by the rotating shaft. Cables are connected to the rings. In addition, a brush fixing member for fixing the brushes, which are also made of a conductive material, is arranged at a certain distance from the rotating shaft. In this way, the brushes are fixed to contact the rings.

The rings and the brushes contact each other and are held so that the rings and brushes can slide on each other. In this way, power or a signal that is input from one of the ring side and the brush side is transmitted to the other side via contacts.

The contacts where the brushes and rings contact each other are always slid on each other. Consequently, since sliding surfaces are deteriorated by friction or the like, desired power and a desired signal may not be transmitted. To respond to such issue, Japanese Patent Application Laid-Open No. 9-28060 discusses a monitoring system capable of detecting deterioration of a sliding surface based on an increase in contact resistance, monitoring the state of a sliding contact of a slip ring, and notifying a user of the state. According to Japanese Patent Application Laid-Open No. 9-28060, a power supply circuit and a shunt resistor are connected in series with a slip ring, and a meter relay, a sequencer, and an alarming device are connected in series with the shunt resistor. With this configuration, change of a current value, which is caused when the contact resistance of the slip ring is increased, can be converted into a voltage by the shunt resistor, and the voltage can be detected.

However, the above slip ring has a problem that change in wiring resistance between the slip ring and the shunt resistor and change in contact resistance caused by deterioration of the sliding surface cannot be separately detected. Namely, the deterioration of the slip ring cannot be independently detected. For example, when the slip ring is installed at a joint of a machine such as an industrial robot arm, fatigue/deterioration of wirings may be caused by flexion of wirings as the robot arm operates. As a result, the wiring resistance may be changed. Thus, the slip ring monitoring system discussed in Japanese Patent Application Laid-Open No. 9-28060 cannot distinguish the fatigue/deterioration of wirings from the deterioration of the slip ring. In addition, for example, if the length of a wiring is increased and noise is mixed in the voltage from the power supply circuit, change in the contact resistance cannot be accurately detected.

SUMMARY OF THE INVENTION

The present disclosure is directed to a method for accurately detecting the state of electrical continuity of a slip ring.

According to an aspect disclosed herein, a slip ring includes an exterior, a plurality of brushes, a plurality of rings, a brush fixing member that causes the plurality of brushes to contact the plurality of rings and supports the plurality of brushes, and a rotating shaft inserted into the plurality of rings and supports the plurality of rings. The slip ring also includes a reference signal generation unit configured to generate a reference signal and a detection unit configured to detect a signal, wherein a circuit is formed by the reference signal generation unit, a first brush, which is at least one of the plurality of brushes, a first ring that contacts the first brush, and the detection unit, and wherein a state of contact of the first brush and the first ring is detected based on the signal detected by the detection unit.

Further features of the present invention will become apparent from the following description of exemplary embodiments with reference to the attached drawings.

BRIEF DESCRIPTION OF THE DRAWINGS

FIGS. 6A and 6B illustrate a slip ring electrical system including an upper controller and a plurality of slip rings.

DESCRIPTION OF THE EMBODIMENTS

Figure 1A:
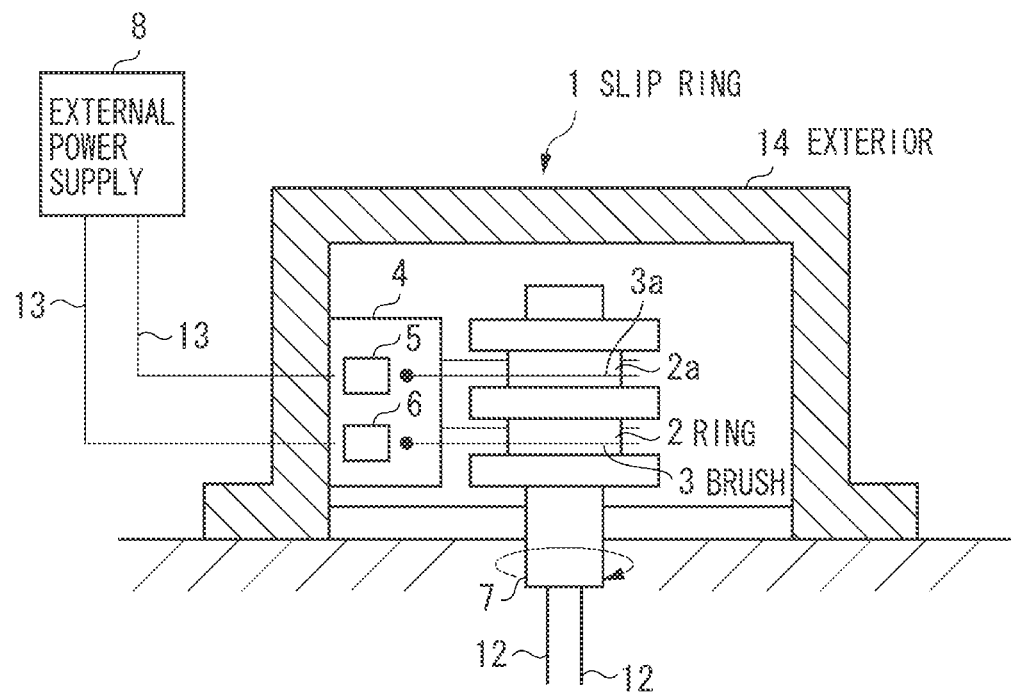
FIGS. 1A and 1B illustrate configurations of a slip ring.

Next, exemplary embodiments of the present invention will be described in detail with reference to the drawings. FIG. 1A illustrates a configuration of a slip ring 1 according to a first exemplary embodiment of the present disclosure. A plurality of rings 2 made of a conductive material and ring insulating members are alternately and concentrically attached to a rotating shaft 7. In addition, for the rotating shaft 7, a plurality of brushes 3 made of a conductive material is arranged at a certain distance from the rotating shaft 7, and a brush fixing member 4 for fixing the plurality of brushes 3 is arranged. The brushes 3 are arranged to contact the rings 2. In addition, the slip ring 1 includes a reference signal generation unit 5 for generating a reference signal and a detection unit 6 for detecting deterioration of sliding contacts based on the reference signal generation unit 5 inside an exterior 14 of the slip ring 1. To ensure more space inside the exterior 14, the reference signal generation unit 5 and the detection unit 6 may be arranged on an outer wall of the exterior 14. Each of the rings is connected to a ring-side output cable 12 and is connected to an input/output connector.

Examples of such "signal" include a current, a voltage, and a certain pulse signal used for detecting deterioration of contacts of the brushes 3 and the rings 2.

In FIG. 1A, a pair of brushes and a ring detect the state of contacts of the rings and the brushes, namely, the state of electrical continuity of sliding contacts, in the slip ring 1 according to the present exemplary embodiment. The pair of brushes and the ring will be hereinafter represented as first brushes 3a and a first ring 2a, respectively. FIG. 1A illustrates a configuration in which the brushes 3a arranged on the respective front- and rear-sides of the first ring 2a contact the first ring 2a.

An external power supply 8 inputs a voltage and a current from outside the slip ring 1. Basically, the slip ring 1 is a device for transmitting power or a signal from the rings 2 or the brushes 3 to the other. Thus, the external power supply 8, as a source of power or a signal, may be connected to either the brushes 3 or the rings 2. However, the following description will be made based on the configuration in which the external power supply 8 is connected to the brushes 3.

As in a conventional slip ring, the brush 3 and the rings 2 in FIG. 1A input and output power and a signal via sliding contacts. In contrast, as will be described step by step, the first brushes 3a and the first ring 2a are included in a circuit and have a function for detecting deterioration of the sliding contacts. A general slip ring includes a plurality of brushes and rings each of which transmits and receives power or a signal. According to the present exemplary embodiment, at least one pair of brush and ring out of the plurality of brushes and rings is used for detecting deterioration of the slip ring 1.

Figure 2A:
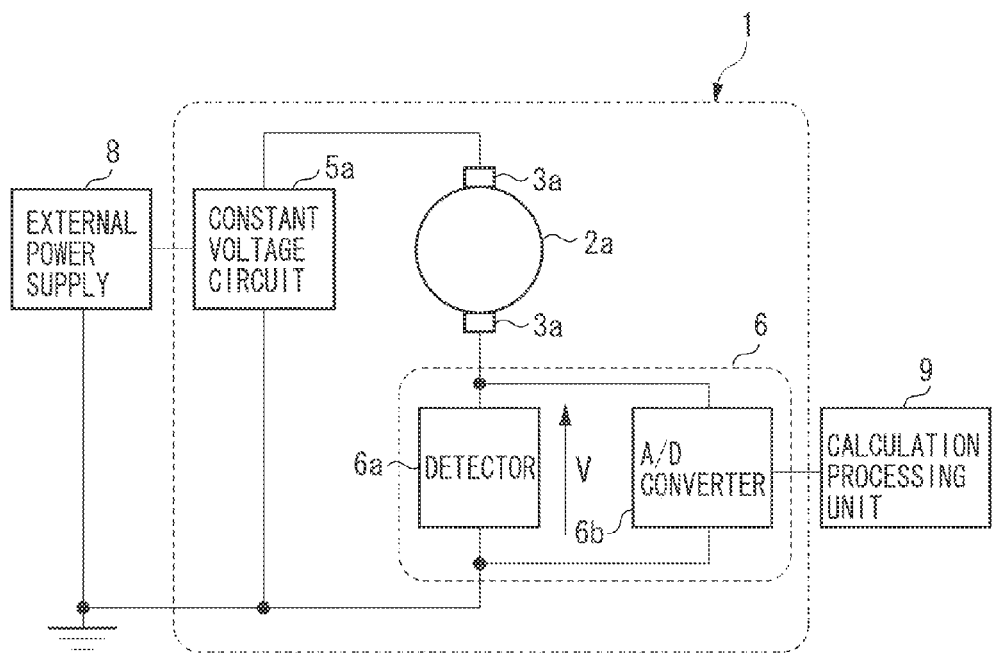
FIGS. 2A and 2B illustrate a detection method used when a constant voltage circuit is used as a reference signal generation unit.

FIG. 2A is a circuit block diagram mainly illustrating a portion having a function of detecting deterioration of sliding contacts of the slip ring 1 in FIG. 1A. The brushes 3 are fixed by the brush fixing member 4 (not illustrated). Hereinafter, a method for detecting deterioration of sliding contacts by using a constant voltage circuit 5a as the reference signal generation unit 5 will be described.

As illustrated in FIG. 2A, according to the present exemplary embodiment, the slip ring 1 includes the constant voltage circuit 5a, and a circuit including the constant voltage circuit 5a, the first brushes 3a, and the first ring 2a is formed. In addition, the circuit includes a detector 6a capable of detecting a voltage. In this way, even when a voltage from the external power supply 8 changes, since the constant voltage circuit 5a stabilizes the voltage, a stable voltage can be supplied to the sliding contacts. In addition, since the constant voltage circuit 5a is arranged inside the slip ring 1, the distance to the sliding contacts as detection targets can be minimized. Consequently, the detection operation is insusceptible to disturbance. The constant voltage circuit 5a can be easily configured by using a series regulator, for example. Since the constant voltage circuit 5a is a known technique, detailed description thereof will be omitted.

The voltage stabilized by the constant voltage circuit 5a is supplied to the circuit including the first ring 2a, the first brushes 3a, and the detector 6a. For example, a shunt resistor is used as the detector 6a. Assuming that the voltage from the constant voltage circuit 5a is V0, the resistance value of the sliding contacts between the first ring 2a and the pair of first brushes 3a is R1, and the resistance value of the detector 6a is R2, a voltage V across the detector 6a can be calculated by $V=R2/(R1+R2) \times V0$. The voltage V across the detector 6a is converted into a digital signal by an analog-to-digital (A/D) converter 6b. Since the digital signal is relatively insusceptible to noise, the digital signal may be directly transmitted to the outside of the slip ring 1 and calculated by a calculation unit. Alternatively, the slip ring 1 may include a calculation processing unit 9 processing the digital signal. If the slip ring 1 includes the calculation processing unit 9, since the calculation processing unit 9 can determine whether the sliding contacts have been deteriorated without transmitting the digital signal to the outside of the slip ring 1, the amount of data transmitted to the outside of the slip ring 1 can be reduced.

Figure 2B:
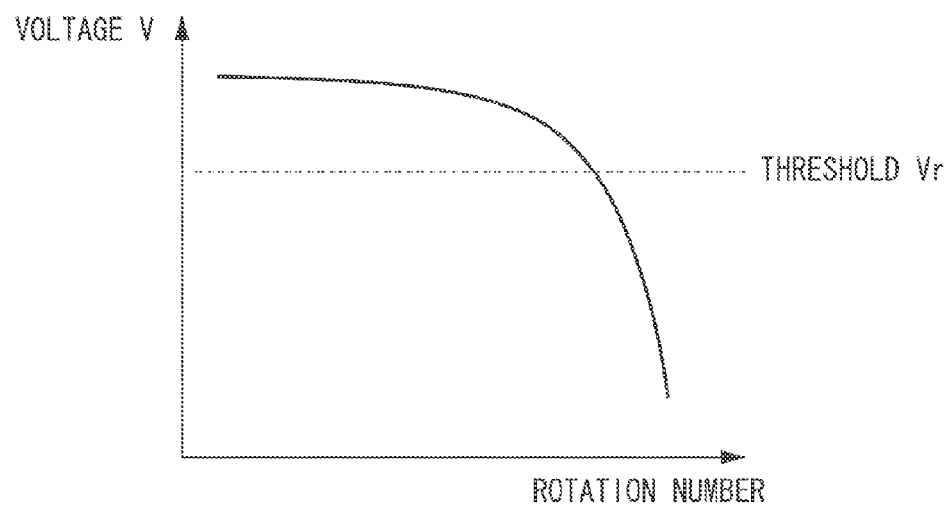

Deterioration of the sliding contacts is detected as follows. If the number of rotations of the first ring 2a and the first brushes 3a is increased, since the brushes 3a and the ring 2a made of the conductive metal are worn out, the resistance value of the sliding contacts is increased. Thus, only the resistance R1, which is used to calculate the voltage V ($V=R2/(R1+R2) \times V0$) across the detector 6a, is increased. As a result, the voltage V is decreased as the rotation number is increased. FIG. 2B illustrates a relationship between the rotation number and the voltage V detected by the detector 6a. As illustrated in FIG. 2B, as the rotation number is increased, the detected voltage V is decreased.

Such phenomenon is used in the present exemplary embodiment. More specifically, by setting an arbitrary voltage as a threshold Vr, deterioration of the sliding contacts can be detected. When a voltage less than the set threshold Vr is detected, it is determined that the contacts have been deteriorated by sliding of the slip ring 1. A decrease of the voltage can be detected by a calculation unit in an electrical apparatus including the slip ring 1, and a user can be notified of deterioration of the slip ring 1 via an interface giving an alert to the user, for example. With such configuration, the user can accurately grasp the state of electrical continuity of the sliding contacts, without disassembling the apparatus. In addition, since a voltage, current, or signal used as a detection reference is generated inside the slip ring 1, influence of surrounding noise can be reduced.

As in the conventional technique (Japanese Patent Application Laid-Open No. 9-28060), there is a method in which the external power supply 8 is directly used as a reference voltage. However, a long wiring exists from the external power supply 8 to the slip ring 1. Thus, because of deterioration of the wiring itself and inflow of disturbance noise, it is difficult to accurately detect only deterioration of sliding contacts. The present exemplary embodiment overcomes this problem by adopting the above configuration.

Next, in a second exemplary embodiment, a method for detecting deterioration of sliding contacts by using a constant current circuit 5b as the reference signal generation unit 5 will be described.

Figure 3A:
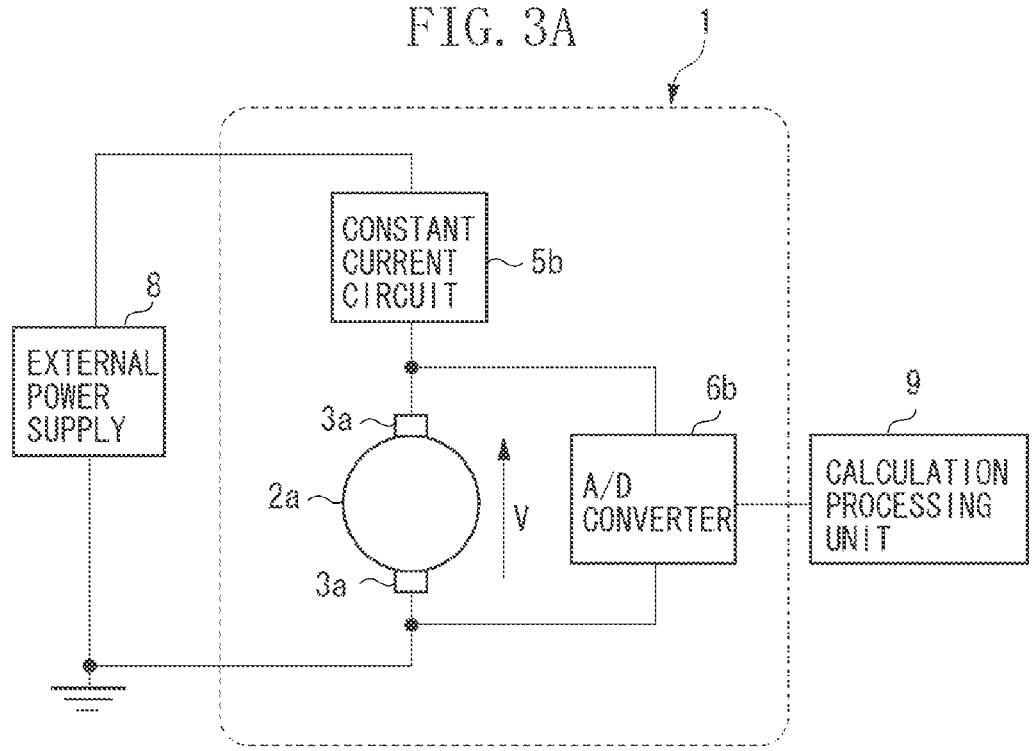
FIGS. 3A and 3B illustrate a detection method used when a constant current circuit is used as the reference signal generation unit.

FIG. 3A illustrates the second exemplary embodiment. The external power supply 8 is connected to the constant current circuit 5b and forms a circuit with the first ring 2a and the first brushes 3a. A portion inside the slip ring 1 indicated by a dashed line corresponds to a configuration of the inside of the exterior 14 in FIG. 1A. Even when the voltage from the external power supply 8 changes, the constant current circuit 5b can always supply a stable current to the sliding contacts. By arranging the constant current circuit 5b in the slip ring 1, the similar advantageous effect as that obtained by arranging the constant voltage circuit 5a in the slip ring 1 can be obtained. Thus, description of the advantageous effect will not be repeated. In addition, the constant current circuit 5b can be easily configured by a series regulator, a field-effect transistor (FET), and the like. Since the constant current circuit 5b is a known technique, detailed description thereof will be omitted.

The current stabilized by the constant current circuit 5b is supplied after the first ring 2a and the first brushes 3a are connected. Assuming that the current value supplied from the constant current circuit 5b is I and the resistance value of the sliding contacts between the first ring 2a and the pair of first brushes 3a is R1, the voltage V across the ring 2a and the brushes 3a can be obtained by $V=I \times R1$. The A/D converter 6b converts the voltage V into a digital signal. If the resistance value of the sliding contacts between the pair of brushes 3a and the ring 2a is as small as several mΩ, since a voltage V across the pair of first brushes 3a via the first ring 2a is very small, deterioration of the sliding contacts may not be sufficiently detected. In such case, the voltage level may be amplified by arranging an amplifier circuit downstream of the A/D converter 6b.

Figure 3B:
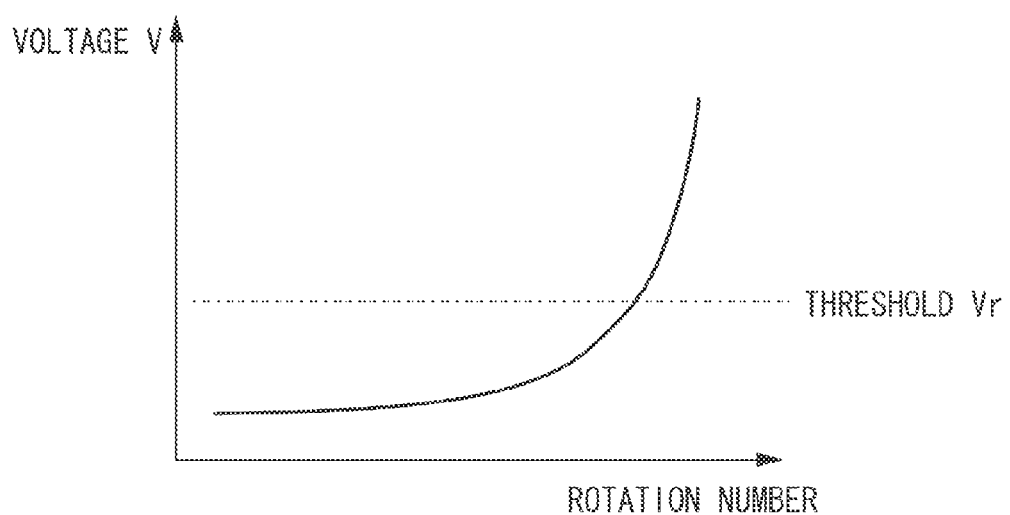

If the number of rotations of the first ring 2a and the first brushes 3a is increased, only the resistance R1 in the expression used to calculate the voltage V (V=I×R1) is increased. As a result, the voltage V is increased as the rotation number is increased. FIG. 3B illustrates change of the voltage V along with the increase of the rotation number. Such phenomenon is used in the present exemplary embodiment. More specifically, by setting an arbitrary voltage as a threshold Vr, deterioration of the sliding contacts can be determined.

Next, a third exemplary embodiment will be described.

So far, methods in which a constant voltage circuit or a constant current circuit is used as the reference signal generation unit 5 have been described. Change of the resistance value of the sliding contacts is detected in either method. However, if only the change of the resistance value is detected, deterioration of the sliding contacts may not be sufficiently detected. This is particularly the case with transmission of a high-frequency signal. Deterioration of the sliding contacts changes not only the resistance component but also the capacitance and inductance components of the contacts. As a result, since impedance matching of the sliding contacts cannot be achieved, reflection or loss is increased, resulting in failure of signal transmission.

Figure 4A:
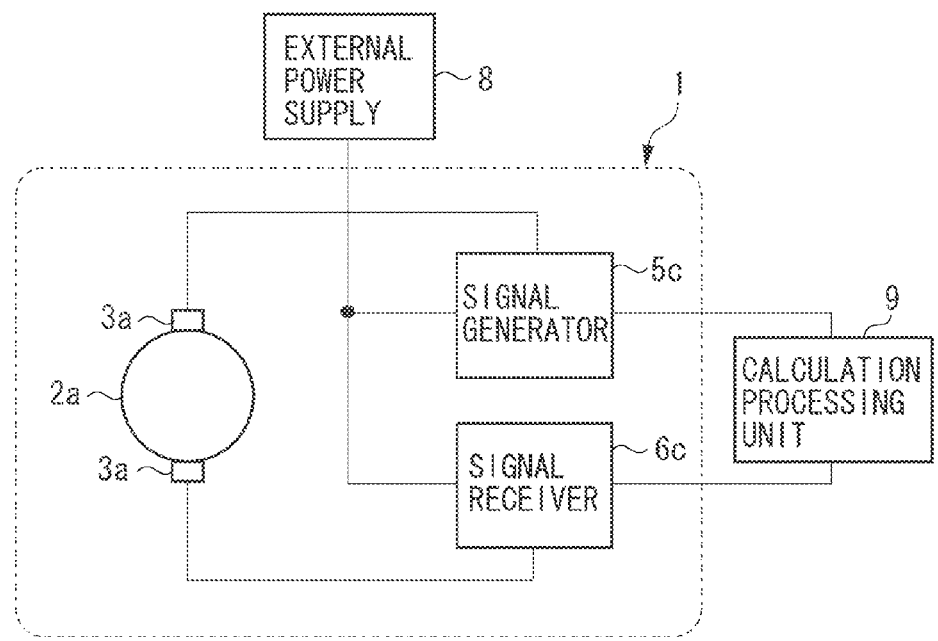
FIGS. 4A and 4B illustrate a detection method used when a signal device is used as the reference signal generation unit.
Figure 4B:
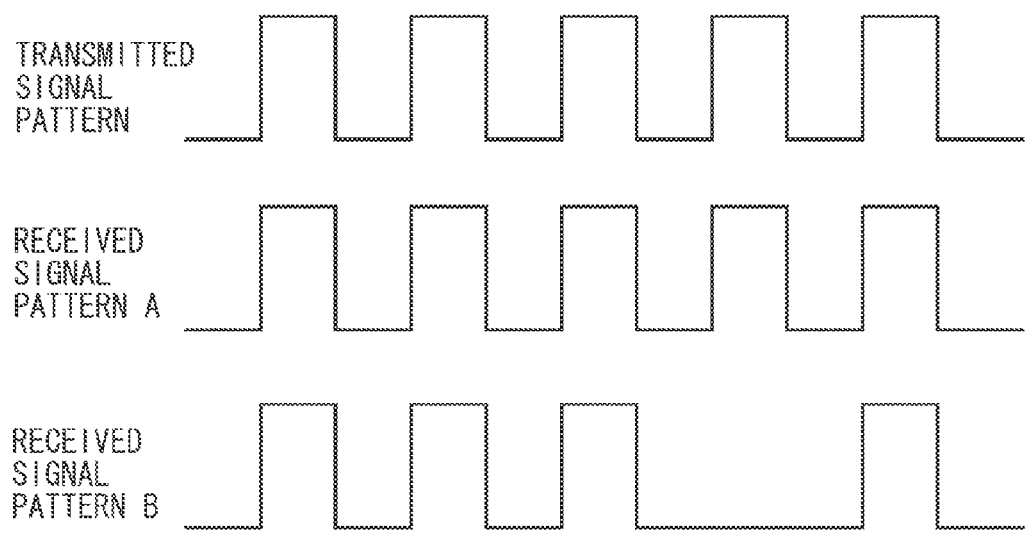

A simple method for detecting deterioration of the sliding contacts in the signal transmission will be described with reference to FIGS. 4A and 4B. In the above exemplary embodiments, a constant voltage circuit or a constant current circuit is used as the reference signal generation unit 5. In the present exemplary embodiment, a signal generator 5c generating a predetermined signal pattern is used as the reference signal generation unit 5. The signal generator 5c may be configured by a electronic component, such as a pulse generator integrated circuit (IC) or a function generator IC.

By using the signal generator 5c, an arbitrary transmission signal pattern is transmitted to the sliding contacts of the first ring 2a and the first brushes 3a. A signal receiver 6c receives a signal that has passed through the sliding contacts. If a received signal pattern A is compared with the transmitted signal pattern, it is seen that both waveforms match each other at a certain level or more. Thus, the received signal pattern A indicates that the sliding contacts do not have problems. In contrast, if a received signal pattern B is compared with the transmitted signal pattern, it is seen that the received signal pattern B does not match the transmitted signal pattern. In such case, there is a possibility that the sliding contacts may be deteriorated. In this way, by supplying a desired signal (for example, a universal serial bus (USB) signal, a recommended standard (RS) 232C signal, or a control area network (CAN) signal) to the sliding contacts of the first ring 2a and the first brushes 3a, a signal that has passed through the sliding contacts may be examined. By arranging the signal generator 5c and the signal receiver 6c in the slip ring 1, the similar advantageous effect as that obtained by using a voltage or a current for the reference signal generation unit 5 can be obtained. Thus, description of the advantageous effect will not be repeated. In addition, while the signal generator 5c and the signal receiver 6c may be configured by, but not limited to, a desired signal controller and a transceiver IC.

As described above, only deterioration of the sliding contacts can be detected by arranging the reference signal generation unit 5 and the detection unit 6 detecting deterioration of the sliding contacts based on the reference signal generation unit 5 in the slip ring 1.

Figure 1B:
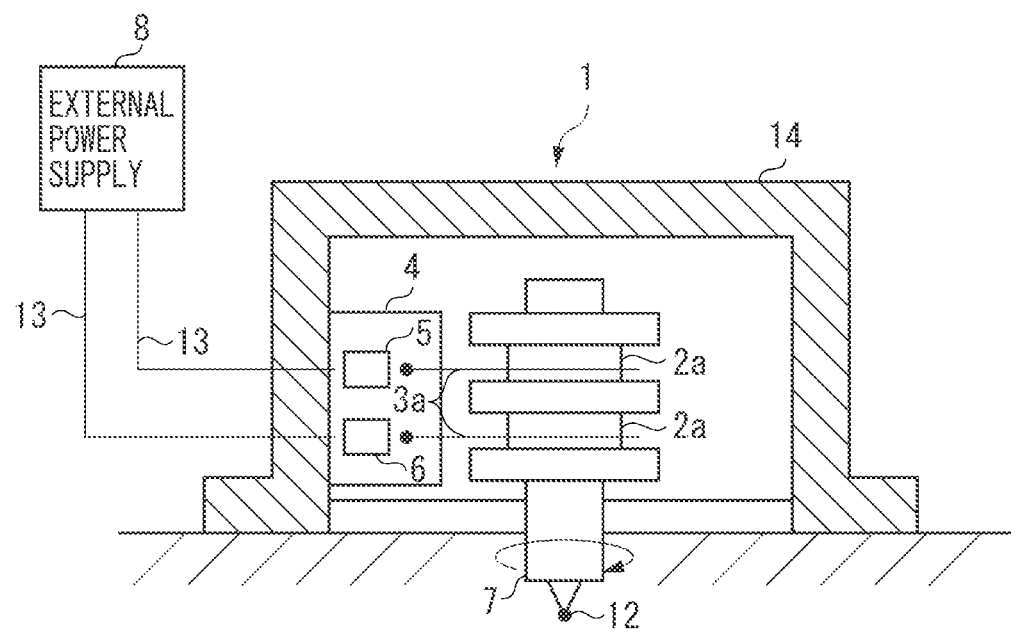

The reference signal generation unit 5 and the detection unit 6 may be arranged at arbitrary places as long as they are arranged inside the slip ring 1. For example, as illustrated in FIGS. 1A and 1B, the reference signal generation unit 5 and the detection unit 6 may be arranged in the brush fixing member 4. Since the brush fixing member 4 may be formed by an electrical wiring board, the reference signal generation unit 5, the detection unit 6, which are electrical components, may be mounted on the electrical wiring board with the brushes 3. In this way, size reduction and cost reduction of the slip ring 1 can be achieved. In addition, since the reference signal generation unit 5 and the detection unit 6 are arranged close to the brushes 3 as much as possible, it is possible to detect only the deterioration of the sliding contacts more accurately.

The slip ring 1 in FIG. 1A includes two brushes (a pair of first brushes 3a) for a single ring. In contrast, the slip ring 1 in FIG. 1B includes a single brush and a single ring that contact each other. For connection to the reference signal generation unit 5 and the detection unit 6, the brush side needs two-pole wirings. Such problem can be solved by short-circuiting both ends of output terminals of the ring-side output cable 12. By detecting change of the sliding resistance of two rings and two brushes, deterioration of the contacts can be detected. To detect only the change of the sliding resistance, it is desirable that the ring-side output cable 12 having both ends that are short-circuited be thick and short as much as possible.

Next, a fourth exemplary embodiment will be described.

The slip ring 1 is a device for supplying power or a signal from the outside via the contacts of the brushes 3 and the rings 2. However, with the configuration for detecting deterioration of the sliding contacts as illustrated in FIGS. 2A and 2B to FIGS. 4A and 4B, since the reference signal generation unit 5 and the detection unit 6 are included in a closed circuit, power or a signal from the outside cannot be transmitted via the circuit. Namely, the brushes 3a and the ring 2a for detecting deterioration of the sliding contacts are required separately from the brushes 3 and the rings 2 for transmitting power or a signal, resulting in an increase in the number of contacts.

The increase in the number of contacts can be prevented by arranging switches as switching units. The case where a voltage is used for the reference signal generation unit 5 will be described with reference to FIGS. 5A and 5B. With an ON/OFF operation, switching units 10 can switch connection of the circuit. The switches serving as the switching units 10 are arranged so that the switches can switch electrical continuity between an external wiring and the reference signal generation unit 5 with respect to the brushes 3a included in the circuit. Each of the switching units 10 may be a mechanical switch that can be manually operated or an electrical switch such as a multiplexer.

Figure 5A:
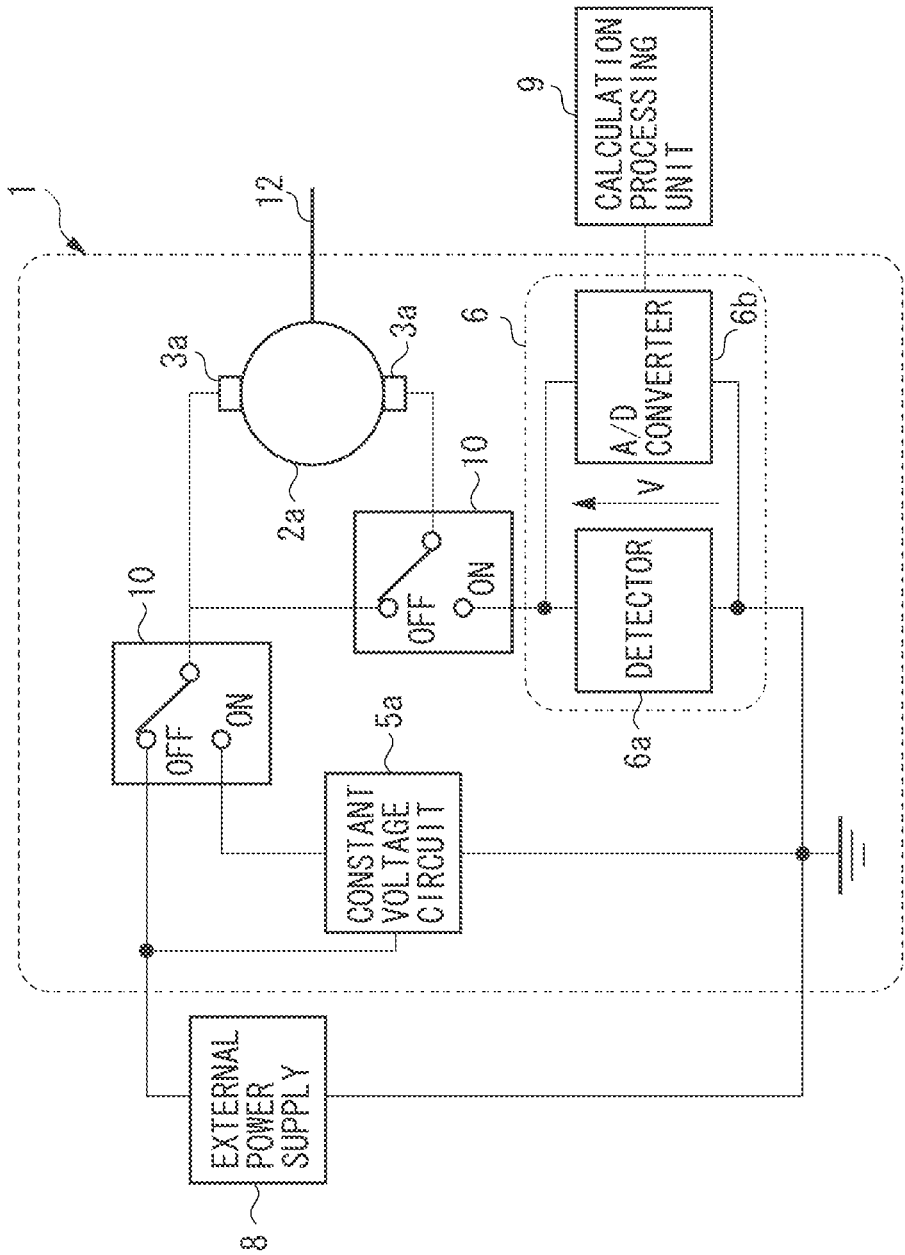
FIGS. 5A and 5B illustrate connection used when switches are used as switching units.

FIG. 5A illustrates the switch units 10 in an state. In the OFF state, the reference signal generation unit 5 and the detection unit 6 does not form a closed circuit. Thus, power to be input from the outside of the slip ring 1 is directly supplied via the sliding contacts of the brushes 3a and the ring 2a.

Figure 5B:
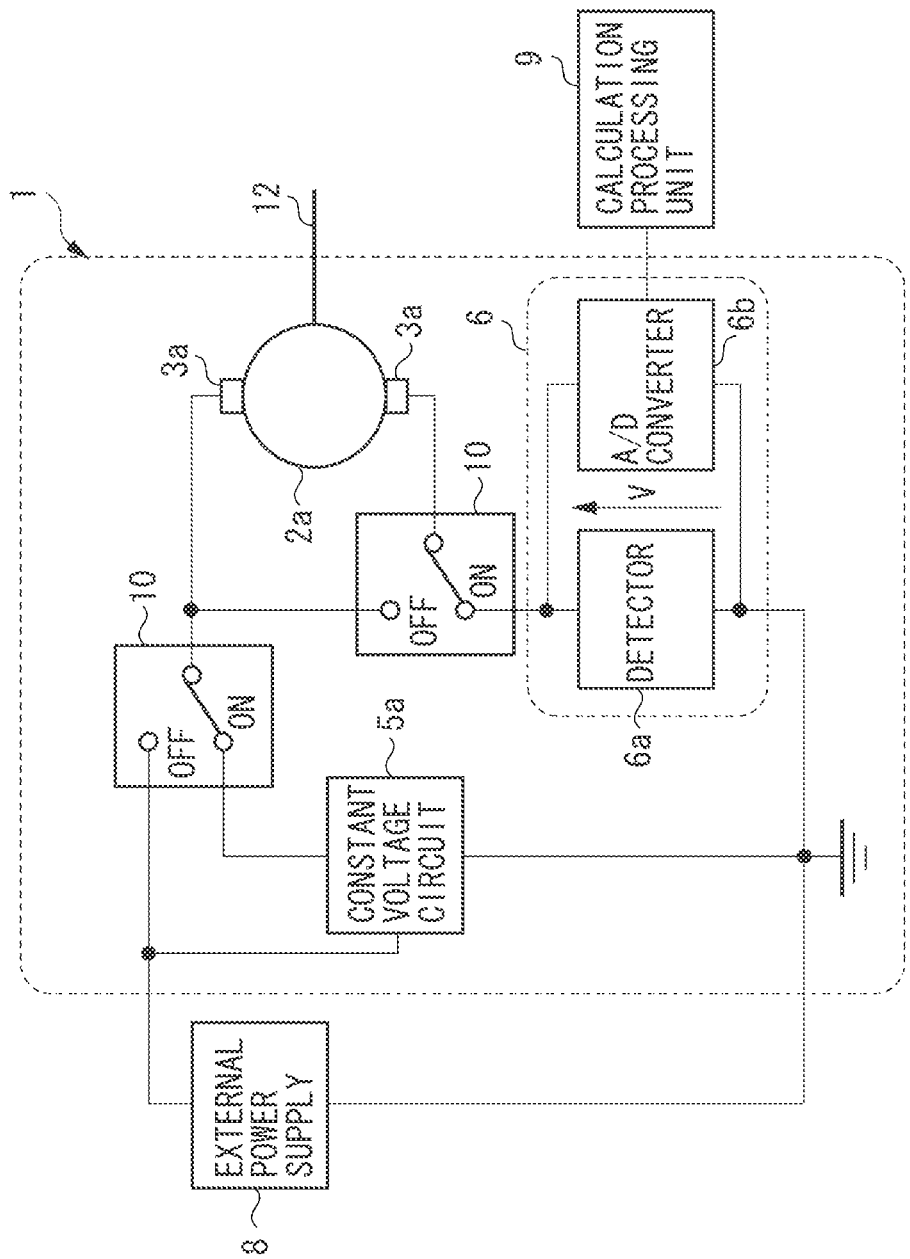

In contrast, FIG. 5B illustrates the switching units 10 in an ON state. In the ON state, the reference signal generation unit 5, the detection unit 6, the brushes 3a, and the ring 2a form a closed circuit. The circuit corresponds to FIG. 2A. The same method for detecting deterioration of the sliding contacts as that described with reference to FIG. 2A is used.

As described above, by arranging switches as the switching units 10, an increase in the number of contacts can be prevented. In addition, in this way, deterioration of the brushes 3 or the rings 2 transmitting power or a signal can be directly measured, which is counted as an advantageous effect.

Next, a fifth exemplary embodiment will be described.

Figure 6B:
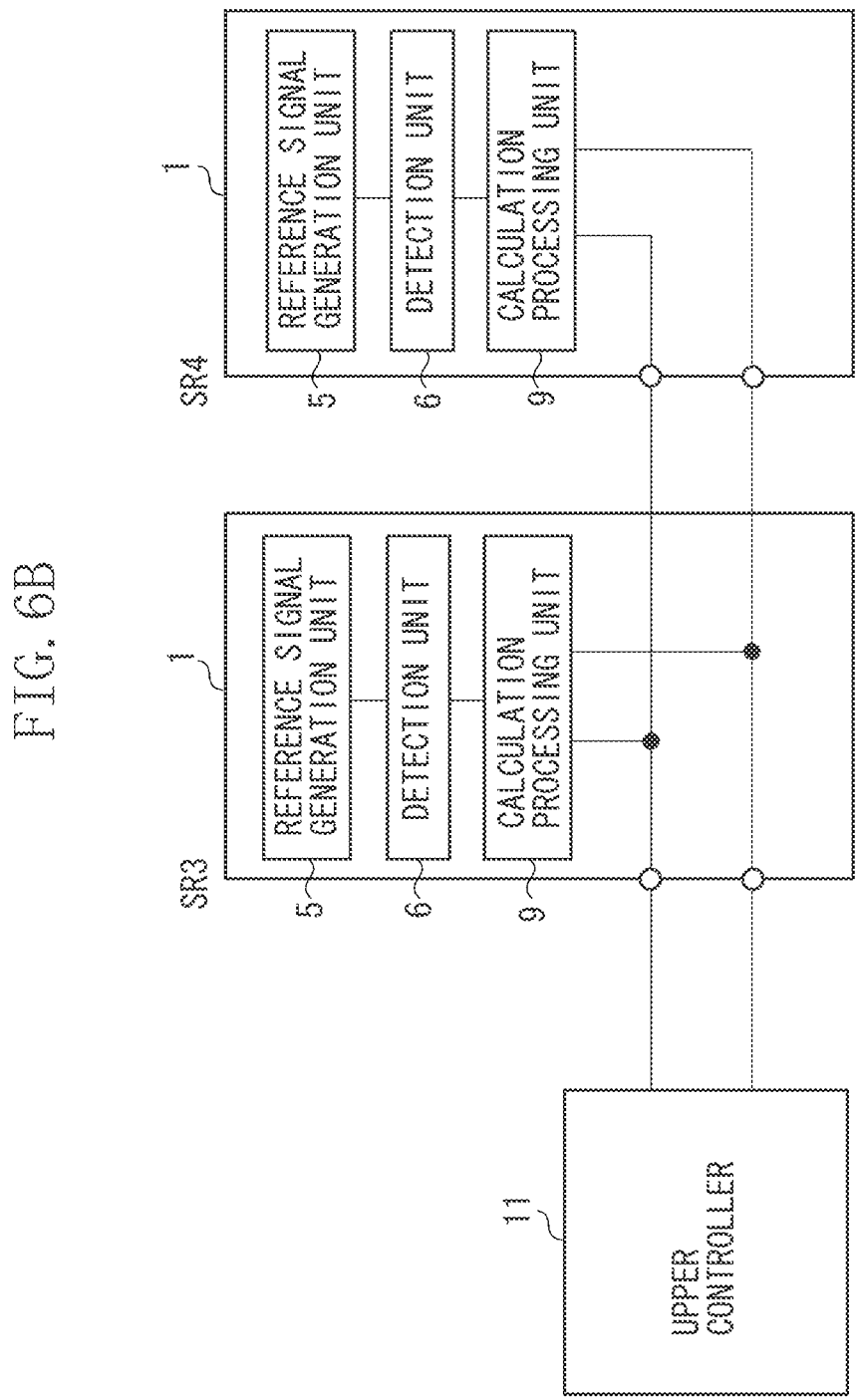

A system configuration suitable to slip rings, each of which includes the reference signal generation unit 5, the detection unit 6, and the calculation processing unit 9 will be described with reference to FIGS. 6A and 6B. FIGS. 6A and 6B illustrate slip ring electrical systems in which serial data is transmitted and received between an upper controller 11 and the calculation processing unit 9 in each slip ring. For example, the present exemplary embodiment assumes a system in which a signal or the like is transmitted from the upper controller 11 to a base of an articulated robot arm fixed on a rack via a slip ring arranged for each joint. The configuration of the present exemplary embodiment is not limited to the above articulated robot arm. The present exemplary embodiment is suitably applicable to a system including a plurality of connected rotors.

According to the configuration of the present exemplary embodiment, by causing the calculation processing unit 9 to notify the upper controller 11 of deterioration of the sliding contacts of each slip ring, the upper controller 11 can grasp the state of the entire system. In addition, it is possible to establish a high-function system in which the calculation processing unit 9 executes frequency analysis on noise components during sliding and the upper controller 11 uses a certain filter based on the analysis result.

FIG. 6A illustrates the upper controller 11 and the calculation processing units 9 that are connected in a star network. FIG. 6B illustrates the upper controller 11 and the calculation processing units 9 that are connected in a bus (line) network.

In the star network connection in FIG. 6A, a pair of wirings is needed for the respective upper controller 11 and a calculation processing unit 9. Thus, while four sliding contacts are needed on the input side of a slip ring SR1, two sliding contacts are needed on the input side of a slip ring SR2. Namely, the number of contacts is different between the slip rings SR1 and SR2 (in FIGS. 6A and 6B, each sliding contact on the input side is indicated by a circle). In addition, as the number of slip rings included in the system is increased, the number of contacts on the input side of the slip ring close to the upper controller 11 is increased. Namely, the slip ring close to the upper controller 11 needs to use a "large" slip ring. In such case, since common slip rings cannot be used, a cost increase is caused.

In contrast, in the bus network connection in FIG. 6B, the upper controller 11 and a plurality of calculation processing units 9 can be connected by a single communication cable, that is, a bus. Thus, two sliding contacts are used on the input side of a slip ring SR3 and a slip ring SR4. Namely, the same number of contacts is used for the slip rings SR3 and SR4. In addition, even if the number of slip rings used in the system is increased, the number of contacts is not changed. In addition, since the slip rings are connected to each other via the bus, a high-function system executing the above sliding noise correction or the like may be provided without arranging the upper controller 11.

As described above, a bus network connection including a plurality of slip rings is a suitable system configuration for each of the slip rings including the reference signal generation unit 5, the detection unit 6, and the calculation processing unit 9.

The exemplary embodiments of the present invention can be suitably used for electrical conductivity of a rotor, such as a joint of a robot arm or the like.

According to the exemplary embodiments of the present disclosure, a reference signal generation unit generating a signal, such as a reference voltage or current, and a detection unit detecting deterioration of sliding contacts based on the reference signal generation unit are included. Thus, the state of electrical continuity of the sliding contacts can be accurately detected. In addition, since the detection reference voltage, current, or signal is generated inside the slip ring, influence of surrounding noise can be reduced.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

This application claims the benefit of Japanese Patent Application No. 2012-186596 filed Aug. 27, 2012, which is hereby incorporated by reference herein in its entirety.

What is claimed is:

1. A slip ring system including an exterior, a plurality of brushes, a plurality of rings, a brush fixing member that causes the plurality of brushes to contact the plurality of rings and supports the plurality of brushes, and a rotating shaft that is inserted into the plurality of rings and supports the plurality of rings, the slip ring system comprising:
   a constant voltage circuit configured to stabilize a voltage from an external power supply;
   a detection unit configured to detect a state of contact of the first brush and the first ring by using a voltage; and
   an interface configured to issue an alert to a user when the detection unit detects a voltage lower than a predetermined threshold voltage,
   wherein a circuit is formed by the constant voltage circuit, a first brush, which is at least one of the plurality of brushes, a first ring that contacts the first brush, and the detection unit.

2. The slip ring system according to claim 1, wherein the constant voltage circuit and the detection unit are included inside the exterior.

3. The slip ring system according to claim 1, wherein the constant voltage circuit and the detection unit are included on an outer wall of the exterior.

4. The slip ring system according to claim 1, further comprising a calculation processing unit connected to the detection unit.

5. The slip ring system according to claim 1, further comprising a switching unit configured to switch electrical continuity between the reference signal generation unit and an external wiring, and arranged between the first brush and the reference signal generation unit included in the circuit.

6. The slip ring system according to claim 1, wherein the reference signal generation unit and the detection unit are arranged at the brush fixing member that fixes the brushes.

7. The slip ring system according to claim 1, wherein the circuit is formed by short-circuiting two output terminals of the slip ring.

8. The slip ring system according to claim 1, wherein the constant voltage circuit is series regulator.

9. A slip ring system including an exterior, a plurality of brushes, a plurality of rings, a brush fixing member that causes the plurality of brushes to contact the plurality of rings and supports the plurality of brushes, and a rotating shaft that is inserted into the plurality of rings and supports the plurality of rings, the slip ring system comprising:

a constant current circuit configured to stabilize a current from an external power supply;

a detection unit configured to detect a state of contact of the first brush and the first ring by using a voltage; and an interface configured to issue an alert to a user when the detection unit detects a voltage lower than a predetermined threshold voltage, wherein a circuit is formed by the constant current circuit, a first brush, which is at least one of the plurality of brushes, a first ring that contacts the first brush, and the detection unit.

10. The slip ring system according to claim 9, further comprising:

an upper controller; and a plurality of the slip rings wherein a network is formed in which calculation processing units each included in the respective slip rings are connected to the upper controller.

11. The slip ring system according to claim 10, wherein the calculation processing units, each of which calculates a result obtained by a corresponding one of detection units, are connected by a bus network.

12. The slip ring system according to claim 9, wherein the constant current circuit is a series regulator or a field-effect transistor.

13. The slip ring system according to claim 9, wherein the constant current circuit and the detection unit are included inside the exterior.

14. The slip ring system according to claim 9, wherein the constant current circuit and the detection unit are included on an outer wall of the exterior.

15. The slip ring system according to claim 9, wherein the signal generator and the signal receiver are included on an outer wall of the exterior.

16. A slip ring system including an exterior, a plurality of brushes, a plurality of rings, a brush fixing member that causes the plurality of brushes to contact the plurality of rings and supports the plurality of brushes, and a rotating shaft that is inserted into the plurality of rings and supports the rings, the slip ring comprising:

a signal generator configured to generate a predetermined signal pattern from a voltage from an external power supply;

a signal receiver that receives a signal pattern, wherein the state of contact of the first brush and the first ring is detected by causing the signal receiver to receive the signal pattern that has passed through the first brush and the first ring included in the circuit and by comparing the signal pattern generated by the signal generator with the signal pattern received by the signal receiver; and an interface configured to issue an alert to a user when the signal receiver detects another signal pattern different from the signal pattern.

17. The slip ring system according to claim 16, wherein the signal generator is a pulse generator integrated circuit or a function generator IC.

18. The slip ring system according to claim 16, wherein the signal generator and the signal receiver are included inside the exterior.

* * * * *